(12) United States Patent
Tsang

(10) Patent No.: US 6,933,550 B2
(45) Date of Patent: Aug. 23, 2005

(54) METHOD AND SYSTEM FOR PROVIDING A MAGNETIC MEMORY HAVING A WRAPPED WRITE LINE

(75) Inventor: David Tsang, Cupertino, CA (US)

(73) Assignee: Applied Spintronics Technology, Inc., Milpitas, CA (US)

( * ) Notice: Subject to any disclaimer, the term of this patent is extended or adjusted under 35 U.S.C. 154(b) by 0 days.

(21) Appl. No.: 10/781,478

(22) Filed: Feb. 17, 2004

(65) Prior Publication Data

US 2004/0188734 A1 Sep. 30, 2004

Related U.S. Application Data

(60) Provisional application No. 60/458,392, filed on Mar. 31, 2003.

(51) Int. Cl.[7] .......................... H01L 31/119; G11C 7/02
(52) U.S. Cl. ........................ 257/295; 257/443; 365/209; 365/66; 365/74; 365/97
(58) Field of Search ................................ 257/295, 443; 365/66, 74, 97, 209

(56) References Cited

U.S. PATENT DOCUMENTS

| | | | |
|---|---|---|---|
| 5,659,499 A | 8/1997 | Chen et al. | |
| 5,940,319 A | 8/1999 | Durlam et al. | |
| 6,153,443 A | 11/2000 | Durlam et al. | |
| 6,211,090 B1 | 4/2001 | Durlam et al. | |
| 6,335,890 B1 | 1/2002 | Reohr et al. | |
| 6,621,730 B1 * | 9/2003 | Lage | 365/158 |
| 6,757,189 B2 * | 6/2004 | Hung et al. | 365/158 |
| 2002/0034117 A1 | 3/2002 | Okazawa | |
| 2002/0080643 A1 | 6/2002 | Ito | |
| 2002/0127743 A1 | 9/2002 | Nickel et al | |
| 2004/0130936 A1 * | 7/2004 | Nguyen et al. | 365/158 |

* cited by examiner

Primary Examiner—Michael Tran
Assistant Examiner—Long Tran
(74) Attorney, Agent, or Firm—Sawyer Law Group LLP

(57) ABSTRACT

A method and system for providing magnetic memory are disclosed. The method and system include providing a plurality of magnetic memory elements and providing at least one wrapped write line. Each wrapped write line includes a bottom write line and a top write line electrically connected to the bottom write line. The bottom write line resides below a portion of the plurality of magnetic elements, while the top write resides above the portion of the plurality of magnetic elements. The bottom write line carries a first current in a first direction, while the top write line carries a second current in a second direction opposite to the first direction.

12 Claims, 10 Drawing Sheets

METHOD AND SYSTEM FOR PROVIDING A MAGNETIC MEMORY HAVING A WRAPPED WRITE LINE

CROSS-REFERENCE TO RELATED APPLICATIONS

This application is claiming under 35 USC 119(e) the benefit of provisional patent application Ser. No. 60/458,392 filed on Mar. 31, 2003.

The present application is related to co-pending U.S. patent application Ser. No. 10/459,133 entitled "MRAM MEMORIES UTILIZING MAGNETIC WRITE LINES" filed on Jun. 11, 2003, and assigned to the assignee of the present application.

FIELD OF THE INVENTION

The present invention pertains to reading nonvolatile magnetic memories, such as a magnetic random access memory (MRAM), and more particularly to a method and system for providing a more reliable magnetic element that is less subject to variations due to processing.

BACKGROUND OF THE INVENTION

In magnetoresistive random access memory (MRAM) devices, the memory cells are typically programmed by magnetic fields induced by current carrying conductor lines such as copper lines or aluminum lines. Typically, two orthogonal interconnects are employed, with one positioned above the magnetic memory device and the second positioned below the magnetic memory device.

FIG. 1A depicts a portion of such a conventional MRAM 1. The conventional MRAM includes conventional orthogonal conductive lines 10 and 12, conventional magnetic storage cell having a conventional magnetic tunneling junction (MTJ) stack 30 and a conventional transistor 13. In some designs, the conventional transistor 13 is replaced by a diode, or completely omitted, with the conventional MTJ cell 30 in direct contact with the conventional word line 10. Use of a conventional MTJ stack 30 makes it possible to design an MRAM cell with high integration density, high speed, low read power, and soft error rate (SER) immunity. However, the conventional MRAM 1 might be fabricated with a memory cells using a variety of magnetic elements, such as an Anisotropic Magnetoresistance (AMR) element, a Giant Magnetoresistance (GMR) element, and a Magnetic Tunneling Junction (MTJ) stack.

The conductive lines 10 and 12 are used for writing data to the magnetic storage device 30. The MTJ stack 30 is located at the intersection of and between conventional conductive lines 10 and 12. Conventional conductive lines 10 and 12 are referred to as the conventional word line 10 and the conventional bit line 12, respectively. The names, however, are interchangeable. Other names, such as row line, column line, digit line, and data line, may also be used. The magnetic field for changing the orientation of the changeable magnetic vector is usually supplied by two conductive lines that are substantially orthogonal to each other. When electrical current passes through the two conductive lines at the same time, two magnetic fields associated with the current in the two conductive lines act on the changeable magnetic vector to orient its direction.

The conventional MTJ 30 stack primarily includes the free layer 38 with a changeable magnetic vector (not explicitly shown), the pinned layer 34 with a fixed magnetic vector (not explicitly shown), and an insulator 36 in between the two magnetic layers 34 and 38. The insulator 36 typically has a thickness that is low enough to allow tunneling of charge carriers between the magnetic layers 34 and 38. Thus, the insulator 36 typically acts as a tunneling barrier between the magnetic layers 34 and 38. Layer 32 is usually a composite of seed layers and an antiferromagnetic (AFM) layer that is strongly coupled to the pinned magnetic layer. The AFM layer included in the layers 32 is usually Mn alloy, such as IrMn, NiMn, PdMn, PtMn, CrPtMn, and so on. The AFM layer is typically strongly exchanged coupled to the pinned layer 34 to ensure that the magnetic vector of the pinned layer 34 is strongly pinned in a particular direction. The conventional MTJ stack 30 may also include a capping layer (not shown).

When the magnetic vector of the free layer 38 is aligned with that of the pinned layer 34, the MTJ stack 30 is in a low resistance state. When the magnetic vector of the free layer 38 is antiparallel to that of the pinned layer 34, the MTJ stack 30 is in a high resistance state. Thus, the resistance of the MTJ stack 30 measured across the insulating layer 34 is lower when the magnetic vectors of the layers 34 and 38 are parallel than when the magnetic vectors of the layers 34 and 38 are in opposite directions.

Data is stored in the conventional MTJ stack 30 by applying a magnetic field to the conventional MTJ stack 30. The applied magnetic field has a direction chosen to move the changeable magnetic vector of the free layer 30 to a selected orientation. During writing, the electrical current $I_1$ flowing in the conventional bit line 12 and $I_2$ flowing in the conventional word line 10 yield two magnetic fields on the free layer 38. In response to the magnetic fields generated by the currents $I_1$ and $I_2$, the magnetic vector in free layer 38 is oriented in a particular, stable direction. This direction depends on the direction and amplitude of $I_1$ and $I_2$ and the properties and shape of the free layer 38. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Although the MRAM 1 functions, one of ordinary skill in the art will readily recognize that it is desirable to reduce the current used in writing to the MTJ stack 30. The current typically used is on the order of several milli-Amperes for each of the conductive lines 10 and 12. Therefore, one of ordinary skill in the art will also recognize that a smaller writing current is desired for many memory applications.

FIG. 1B depicts a portion of a conventional magnetic memory 1' that has a somewhat lower writing current. Similar systems are described in U.S. Pat. No. 5,659,499, U.S. Pat. No. 5,940,319, U.S. Pat. No. 6,211,090, U.S. Pat. No. 6,153,443, and U.S. Patent Application Publication No. 2002/0127743. The conventional systems and conventional methods for fabricating the conventional systems disclosed in these references encapsulate bit lines and word lines with soft magnetic cladding layer on the three surfaces not facing MTJ cell 11' in a manner similar to that which is described below. In addition, many of the portions of the conventional memory depicted in FIG. 1B are analogous to those depicted in FIG. 1A and are thus labeled similarly. The system 1' depicted in FIG. 1B includes the conventional MTJ cell 30', conventional word line 10' and bit line 12'. The conventional word line 10' is composed of two parts: a copper core 11 and a soft magnetic cladding layer 9. Similarly, the conventional bit line 12' is composed of two parts: a copper core 15 and a soft magnetic cladding layer 13.

The soft magnetic cladding layers 9 and 13 can concentrate the magnetic flux associated with $I_1$ and $I_2$ onto the MTJ cell 30' and reduce the magnetic field on the surfaces which are not facing the MTJ cell 30'. Thus, the soft magnetic cladding layers 9 and 13 concentrate the flux on the MTJ that makes up the MTJ cell 30', making the free layer 38 easier to program. The conventional MRAM 1' can thus achieve a significant improvement in the write efficiency over the conventional MRAM 1.

Although these approaches work to a certain extent, one of ordinary skill in the art will readily recognize that a further reduction in current is desirable. In addition, in certain applications, particularly portable devices such as mobile phones, personal digital assistants, or palm top computers, battery life is an important design factor. A reduction in current could dramatically decrease the power consumption of the memory and, therefore, extend the life of the battery for the device.

Accordingly, what is needed is a method and system for providing a magnetic memory capable of being written using a lower current.

SUMMARY OF THE INVENTION

The present invention provides a method and system for providing a magnetic memory. The method and system comprise providing a plurality of magnetic memory elements and providing at least one wrapped write line. Each wrapped write line includes a bottom write line and a top write line electrically connected to the bottom write line. The bottom write line resides below a portion of the plurality of magnetic elements, while the top write resides above the portion of the plurality of magnetic elements. The bottom write line carries a first current in a first direction, while the top write line carries a second current in a second direction opposite to the first direction.

According to the system and method disclosed herein, the present invention provides a magnetic memory capable of being programmed using a lower current.

DETAILED DESCRIPTION OF THE INVENTION

The present invention provides a method and system for reading a magnetic memory including a plurality of magnetic elements. The method and system comprise determining a first resistance of at least one of the plurality of magnetic elements. The method and system also comprise applying a disturb magnetic field to the at least one of the plurality of magnetic elements and determining a second resistance of the at least one of the plurality of magnetic elements while the disturb magnetic field is applied. The method and system further comprise comparing the first resistance to the second resistance.

Co-pending U.S. patent application Ser. No. 10/459,133 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application.

Figure 2:
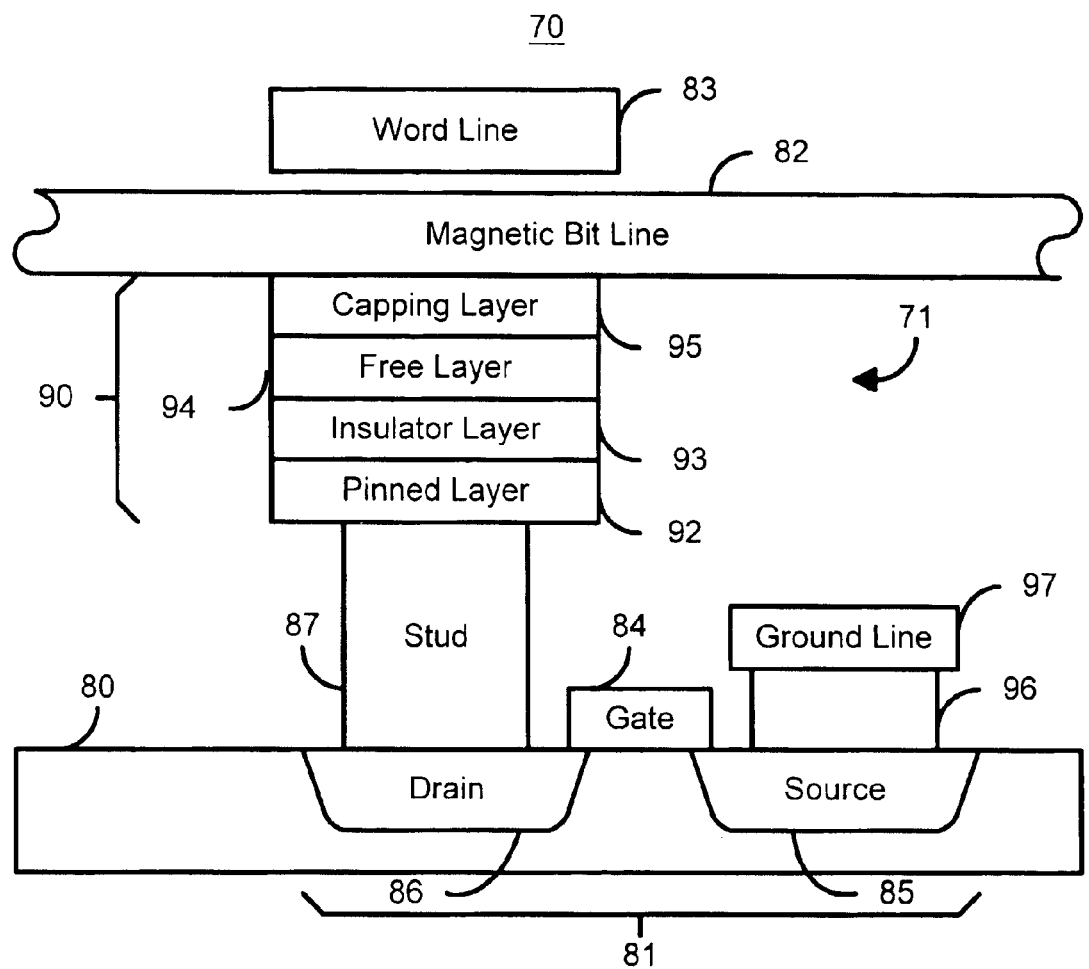
FIG. 2 depicts a cross-sectional view of an architecture including a MTJ MRAM cell and a magnetic write line.

FIG. 2 depicts one embodiment of a portion of an MRAM 70 including the basic structure described in the above-identified co-pending application. The MRAM 70 depicted in FIG. 2 includes a magnetic cell 71 having a magnetic element 90, which is preferably a MTJ stack 90. The MRAM 70 includes a selection device 81 formed in a substrate 80, a magnetic write line 82, a bit line 83, a conductive stud 87, connecting stud 96 and ground line 97. The selection device 81 is preferably a FET transistor including gate 84, source 85 and drain 86. The MTJ stack also includes the pinned layer 92 having a fixed magnetic vector (not shown), a tunneling layer 93, a free layer 94 having a changeable magnetic vector (not shown), and a conductive capping layer 95. The conductive capping layer 95 is preferably a nonmagnetic spacer layer 95. The MTJ stack includes layers (not explicitly shown) that includes seed and, preferably, antiferromagnetic layers.

The magnetic write line 82 includes soft magnetic materials and is separated from the free layer 94 of the MTJ stack 90 by the non-magnetic spacer layer 95. In one embodiment, the write line 83 is also magnetic. The magnetic write line 82 is preferably substantially or completely composed of a soft magnetic material. In addition, at least a core, as opposed to a cladding layer, includes the soft magnetic layer. In another embodiment, the magnetic write line 82 includes layers some of which are soft magnetic material. In such an embodiment, the soft magnetic layers are preferably alternated with nonmagnetic layers. If the write line 83 is a magnetic write line, then the magnetic write line 83 could have one of the structures including soft magnetic materials described above. The soft magnetic materials preferably include cobalt, nickel, iron, and/or alloys thereof. The magnetic vector of the magnetic write line 82 is preferably oriented substantially parallel to the lengthwise direction of the magnetic write line 82, or horizontal/left-right as depicted in FIG. 2. Because of the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, write efficiency is improved.

Although the MRAM architecture described in the above-identified co-pending application functions well for its intended purpose, one of ordinary skill in the art will readily recognize that an additional reduction in write current, and the attendant reduction in power consumed, is desirable.

The present invention provides a method and system for providing a magnetic memory. The method and system comprise providing a plurality of magnetic memory elements and providing at least one wrapped write line. Each wrapped write line includes a bottom write line and a top write line electrically connected to the bottom write line. The bottom write line resides below a portion of the plurality of magnetic elements, while the top write resides above the portion of the plurality of magnetic elements. The bottom write line carries a first current in a first direction, while the top write line carries a second current in a second direction opposite to the first direction.

The present invention will be described in terms of particular types of magnetic memory elements, particular materials, and a particular configuration of elements. For example, the present invention will be described in the context of illustrative magnetic random access memory (MRAM) cells. One of ordinary skill in the art will, however, recognize that the present invention is not limited to any particular magnetic memory devices. Thus, one of ordinary skill in the art will readily realize that this method and system will operate effectively for other magnetic memory cells, and other materials and configurations non inconsistent with the present invention. Instead, the present invention is applicable to other magnetic memory devices. For example, although certain magnetic tunneling junction (MTJ) stacks are described, nothing prevents the use of other materials, other alloys and synthetic layers, or other magnetic elements. In addition, although the present invention is described in the context of metal-oxide-semiconductor (MOS) devices and MTJ stacks, one of ordinary skill in the art will readily recognize that the present invention is not limited to such devices. Instead, other suitable devices, for example bipolar junction transistor devices and spin-valve giant magnetoresistive memory elements, may be similarly used, with or without modification to the memory architecture. One of ordinary skill in the art will also readily recognize that although the present invention is described in the conjunction of certain other components, such as word and bit lines, including certain materials. However, one of ordinary skill in the art will readily recognize that other components and/or components using different materials not inconsistent with the present invention can be used. Moreover, the present invention is described in the context of single constituents, such as a single MTJ stack and single write lines. However, one of ordinary skill in the art will readily recognize that the method and system apply to and operate effectively for systems having multiple constituents of each type such as multiple magnetic elements, multiple bit lines, and multiple word lines.

Figure 3:
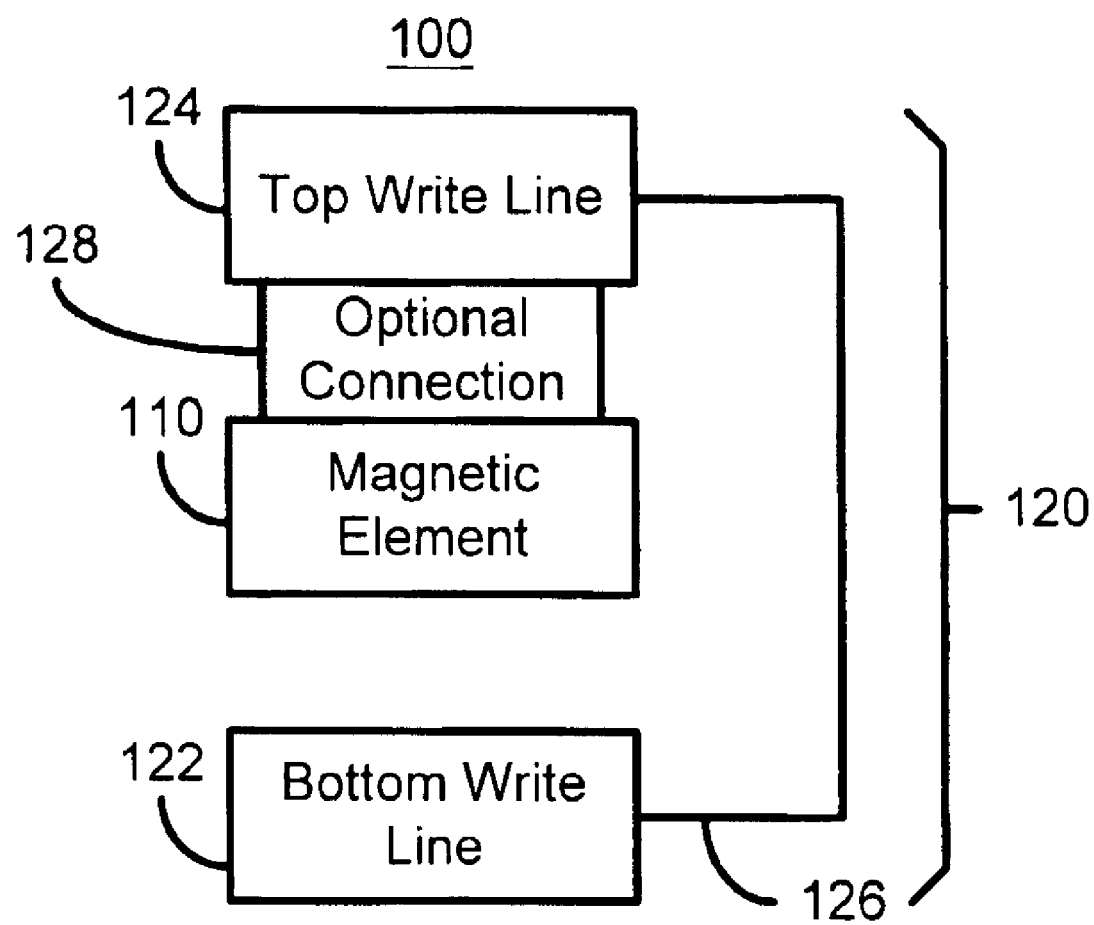
FIG. 3 depicts a high-level block diagram of one embodiment of a magnetic memory utilizing a wrapped write line in accordance with present invention.

To more particularly illustrate the method and system in accordance with the present invention, refer now to FIG. 3 depicting a high-level block diagram of a portion of one embodiment of a magnetic memory 100 utilizing a wrapped write line in accordance with present invention. The magnetic memory includes a magnetic memory cell 110 and a wrapped write line 120. In a preferred embodiment, the magnetic memory cell 110 includes only a magnetic element 112. However, in an alternate embodiment, the magnetic memory cell 110 could include other components (not shown), such as a transistor. The magnetic element 112 is preferably an MTJ stack. However, in another embodiment, other magnetic elements could be used.

The wrapped write line 120 includes a bottom write line 122, a top write line 124, a connector 126 and, in one embodiment, an optional conductor 128. The magnetic memory cell 110 is preferably written using two write lines the wrapped write line 120 and a second write line (not shown). The wrapped write line 120 could be either a bit line or a word line. Consequently, in one embodiment, the top write line 124 of the wrapped write line 120 is electrically connected to the magnetic element 112, for example by being fabricated directly on the magnetic element 110 or by being coupled through optional conductor 128. However, in another embodiment, the wrapped write line 120 is electrically isolated from the magnetic element 112. The connector 126 preferably electrically connects the top write line 124 with the bottom write line 122. In one embodiment, the connector 126 is a conductive plug that is fabricated between the lines 122 and 124 that exist at different levels of the magnetic memory 100. Thus, current can be driven through the bottom write line 122 to the top write line 124, or vice versa.

During programming, current is driven through the wrapped write line 120 in the desired direction. Because the bottom write line 122 and the top write line 124 are electrically connected, current flows in a first direction through the bottom write line 122 and the opposite direction through the top write line 124. For example, if current is driven from the bottom write line 122 to the top write line 124, then as depicted in FIG. 3, current flows from left to write in the bottom write line 122 and from right to left in the top write line 124. Consequently, the magnetic fields generated by the bottom write line 122 and the top write line 124 have the same direction at the magnetic element 112. In the example above, the magnetic fields generated by the bottom write line 122 and the top write line 124 are out of the plane of the page as depicted in FIG. 3. Thus, the currents in bottom write line 122 and the top write line 124 separately contribute to the magnetic fields used in writing to the magnetic element 112. Although they are preferably connected, the bottom write line 122 and the top write line 124 may be lines that are not directly connected and which drive current in opposite directions.

Because of the use of the wrapped word line 120, a lower write current can be used for the wrapped word line 120. As discussed above, the currents in the bottom write line 122 and the top write line 124 separately contribute to the magnetic field required to be generated by the wrapped word line 120 to write to the magnetic element 112. The magnetic field generated by a write line 122 and 124 is proportional to the current in the write line 122 and 124. Thus, a lower of the current can be used to generate a given magnetic field for the wrapped word line 120. In a preferred embodiment, approximately half of the magnetic fields generated by the wrapped write line 120 is generated by each of the write lines 122 and 124. In the preferred embodiment, therefore, half of the current that would otherwise be used can be driven through the wrapped word line 120 (and therefore through the bottom write line 122 and the top write line 124). As a result, a one hundred percent improvement over a conventional single word line can be achieved using the magnetic memory 100 in accordance with the present invention.

Figure 4:
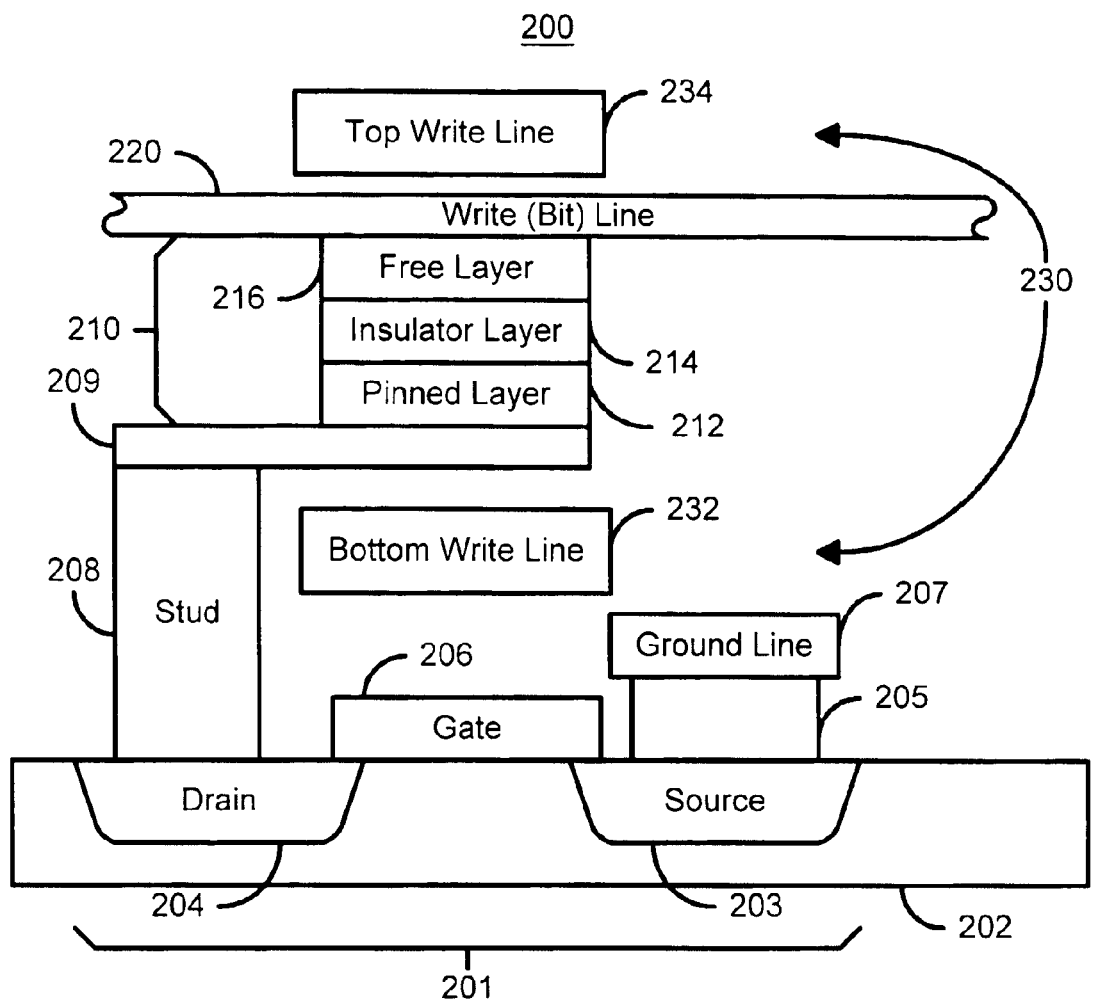
FIG. 4 is a cross-sectional view of a portion of a first embodiment of a magnetic memory including at least one wrapped write line in accordance with the present invention.

FIG. 4 is a cross-sectional view of a portion of a first embodiment of a magnetic memory 200 including at least one wrapped write line in accordance with the present invention. The magnetic memory 200 includes a plurality of magnetic elements 210 only one of which is depicted in FIG. 4, a plurality of selection devices 201 only one of which is depicted in FIG. 4, write bit line 220, and a wrapped write line 230 including a bottom write line 232, and top write line 234. The magnetic element 210 is preferably an MTJ stack 210 that includes a pinned layer 212, an insulating layer 214, and a free layer 216. The MTJ stack 210 may also include other layers (not shown), such as seed, AFM, and capping layers. In a preferred embodiment, the easy axis of the free layer 216 is orthogonal to the write bit line 220. Thus, in a preferred embodiment, the easy axis of the free layer 216 (and thus the stable states of the magnetization of the free layer 216) is perpendicular to the page as shown in FIG. 4. The MTJ stack 210 preferably corresponds to the MTJ stack 90 depicted in FIG. 2. Referring back to FIG. 4, the selection device 201 is formed on a substrate 202 and includes a source 203, a drain 204 and a gate 206. The source 203 is coupled to a ground line 207 via a plug 205. The drain 204 is coupled to the MTJ stack 210 through a plug 208 and conductive layer 209. The selection device 201 thus preferably corresponds to the selection device 81 depicted in FIG. 2.

Figure 1A:
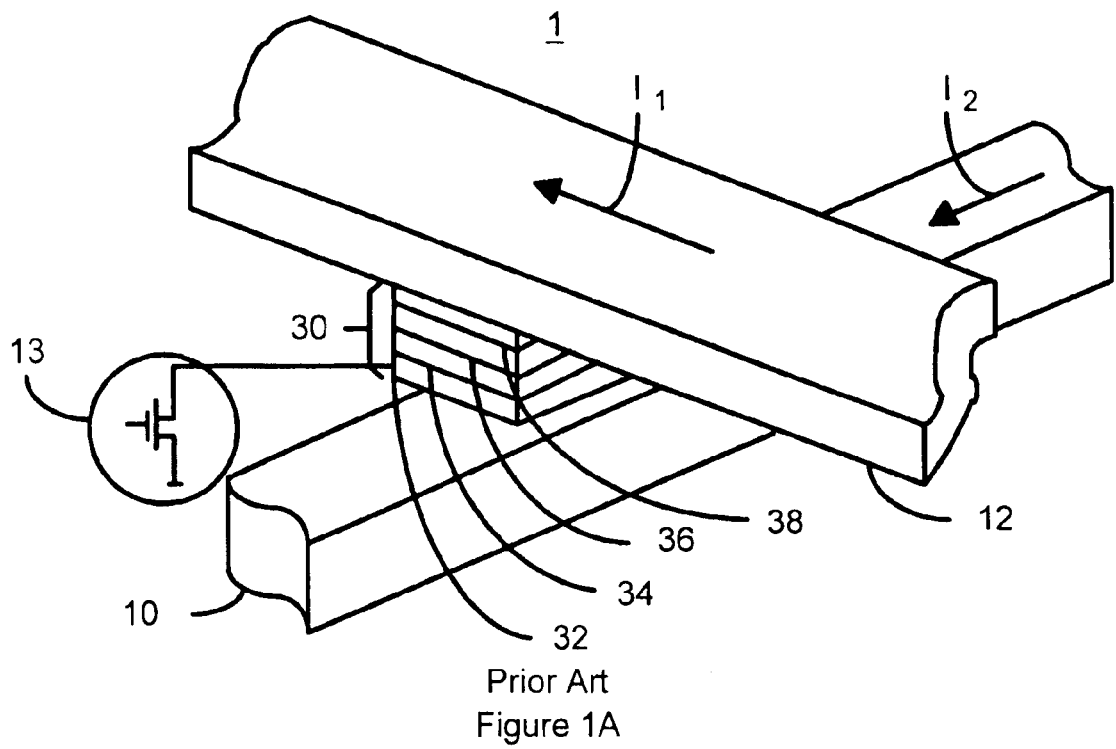
FIG. 1A is a three-dimensional view of a portion of a conventional magnetic memory including a MTJ cell, located at the intersection of a bit line and a word line.
Figure 1B:
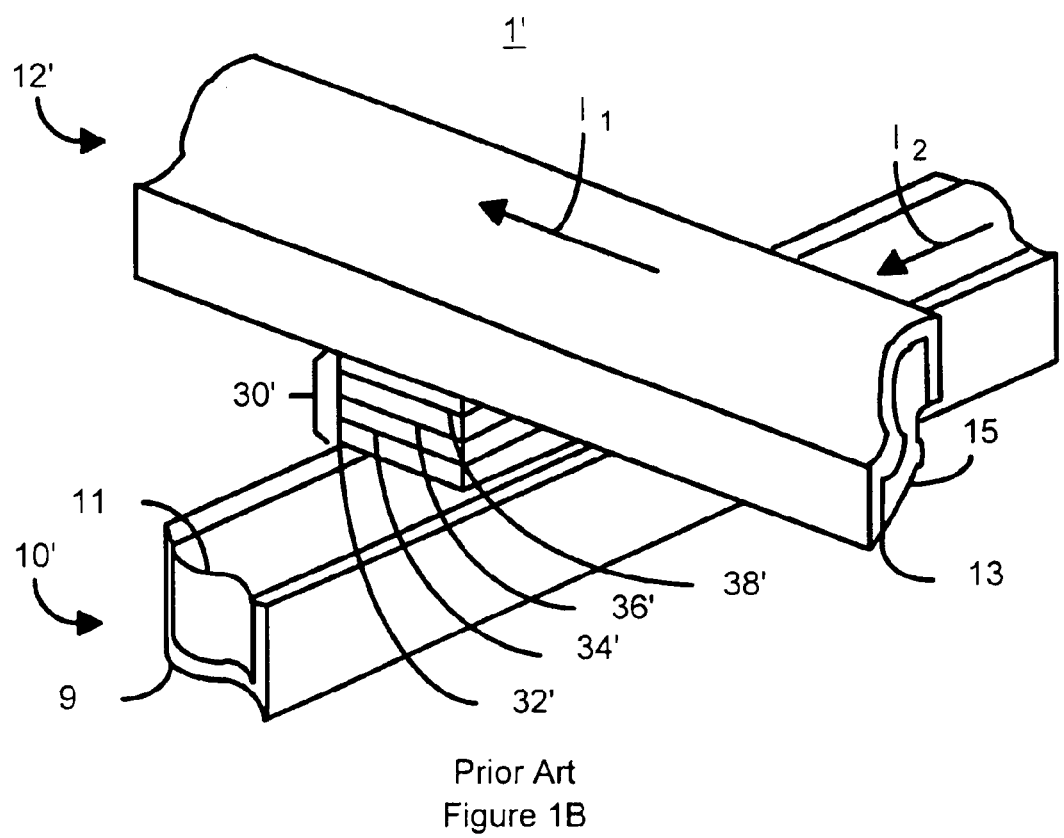
FIG. 1B is a three-dimensional view of a portion of a conventional magnetic memory including a MTJ cell, located at the intersection of a bit line and a word line, where the bit line and the word line have magnetic cladding to improve write efficiency.

Referring back to FIG. 4, the write bit line 220 preferably corresponds to the write bit line 82 of FIG. 2. Referring back to FIG. 4, the write bit line 220 thus preferably magnetic, including a soft magnetic material. In one embodiment, the write bit line 220 includes at least a core and is substantially completely composed of a soft magnetic material. In an alternate embodiment, the write bit line 220 may be laminated with soft magnetic and nonmagnetic layers. In another embodiment, the write bit line 220 may include a nonmagnetic core having surfaces covered in a soft magnetic cladding, in a similar manner to the line 12' depicted in FIG. 1B. In addition, in a preferred embodiment, the thickness of the write bit line 220 is preferably substantially less than the width of the MTJ stack 210. The top write line 234 and/or the bottom write line 232 may also be magnetic. Thus, the bottom write line 232 and/or the top write line 234 may have the structures described above: a soft magnetic material, laminated layers including soft magnetic material layers, or a nonmagnetic core with surfaces covered in a soft magnetic cladding. However, nothing prevents the use of another architecture for the write lines 220, 232, and 234.

The bottom write line 232 and the top write line 234 are electrically connected in series. Thus, the current is driven through both the top write line 234 and the bottom write line 232. Thus, during programming, current passes through the top write line 234 in a first direction, and the bottom write line 232 in a second direction opposite to the first direction. As a result, the magnetic fields generated by the currents in the write lines 232 and 234 add in the region of the MTJ stack 210.

Figure 5:
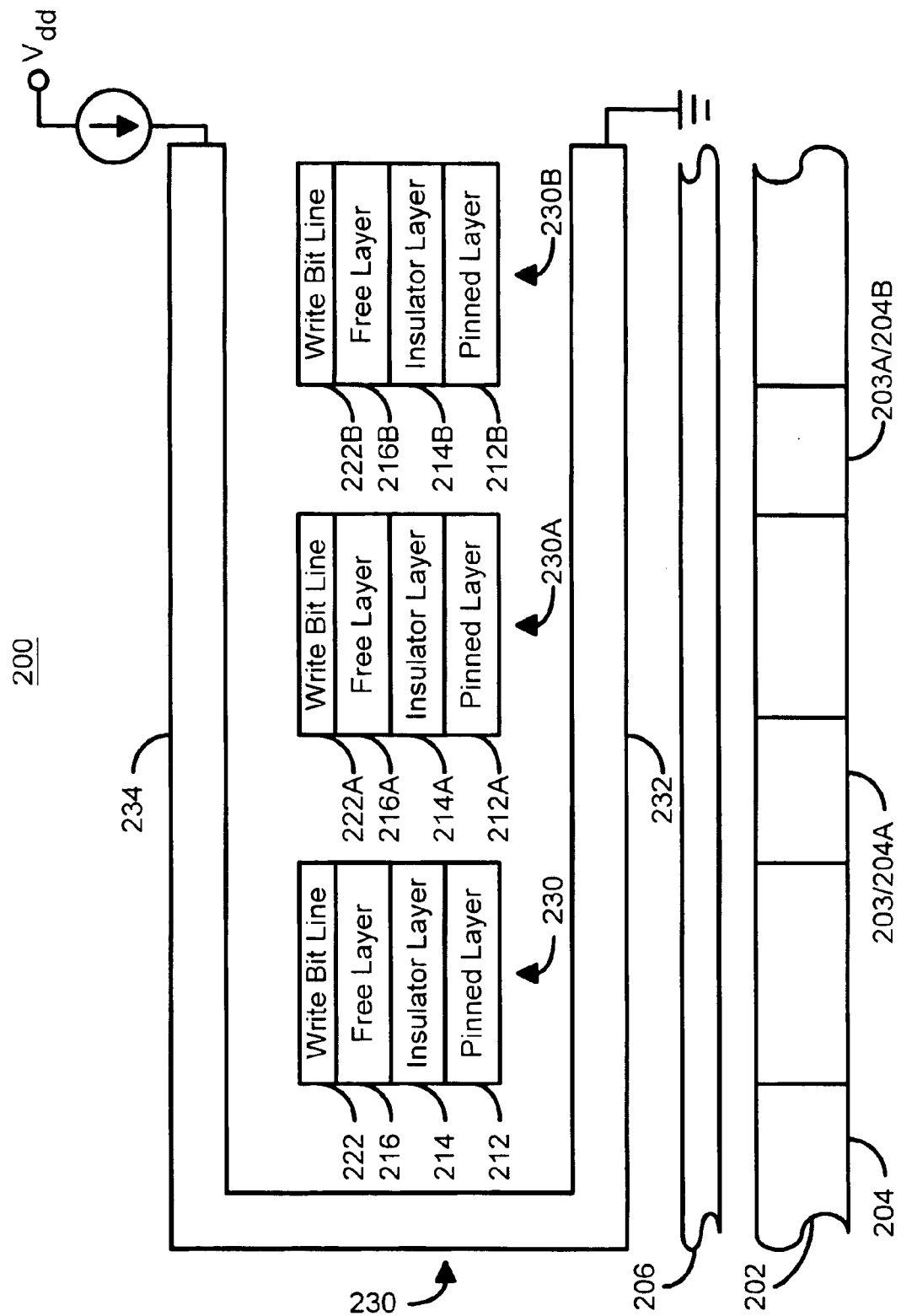
FIG. 5 is a cross-sectional view, orthogonal to the view depicted in FIG. 4, of three magnetic memory cells in the first embodiment of a magnetic memory in accordance with the present invention.

FIG. 5 is a cross-sectional view, orthogonal to the view depicted in FIG. 4, of three magnetic memory cells 210, 210A, and 210B in the first embodiment of a magnetic memory in accordance with the present invention. Thus, bit lines 220, 220A, and 220B are also shown. To program a magnetic memory cell 210, 210A, and/or 210B, an electrical current is fed into the wrapped write line 230. This current passes through the top write line 234 and goes to ground through the bottom write line 232. In an alternate embodiment where the write lines 232 and 234 are not connected, current might simply be driven through the bottom write line 232 in a first direction and through the top write line 234 in the opposite direction. For any one of the three cells 210, 210A, and 210B in FIG. 5, the free layer 216, 216A, and 216B, of the MTJ stack 210, 210A, and 210B, respectively, will be subject to a magnetic field generated by the corresponding bit line 220, 220A, and 220B, respectively. In addition, the free layers 216, 216A, and 216B experiences two magnetic fields associated with the word line current: one associated with the bottom write line 232 and the other associated with the top write line 234. As a consequence, the write efficiency of the word current increases. In a preferred embodiment, where the free layers 216, 216A, and 216B of the MTJ stacks 210, 210A, and 210B, respectively, are approximately equidistant from the bottom write line 232 and the top write line 234, the efficiency is increased by approximately one hundred percent. This is because the desired magnetic field can be generated using half of the current provided by a single write line (not shown) that is not wrapped. A further reduction in write current can be achieved if the wrapped write line 230 is a magnetic write line, as described in the above-identified co-pending patent application. Assuming that the magnetic fields associated with the word current can rotate the magnetization in the free layer 210, 210A, and 210B close to ninety degrees from its easy axis, and then a relatively small current in the bit line 220, 220A, and 220B, respectively, can switch the magnetization direction of the free layer 201, 210A, and 210B, respectively, to complete the write process. The structure in FIG. 5 has three cells 210, 210A, and 210B enclosed by the write word line loop. Therefore, above reduction in power consumption can be realized on all three cells 210, 210A, and 210B. For an MRAM device with sixteen bit parallel writing and reading, the write word line loop can be designed to enclose all sixteen bits to significantly reduce the power consumed during writing.

Figure 6:
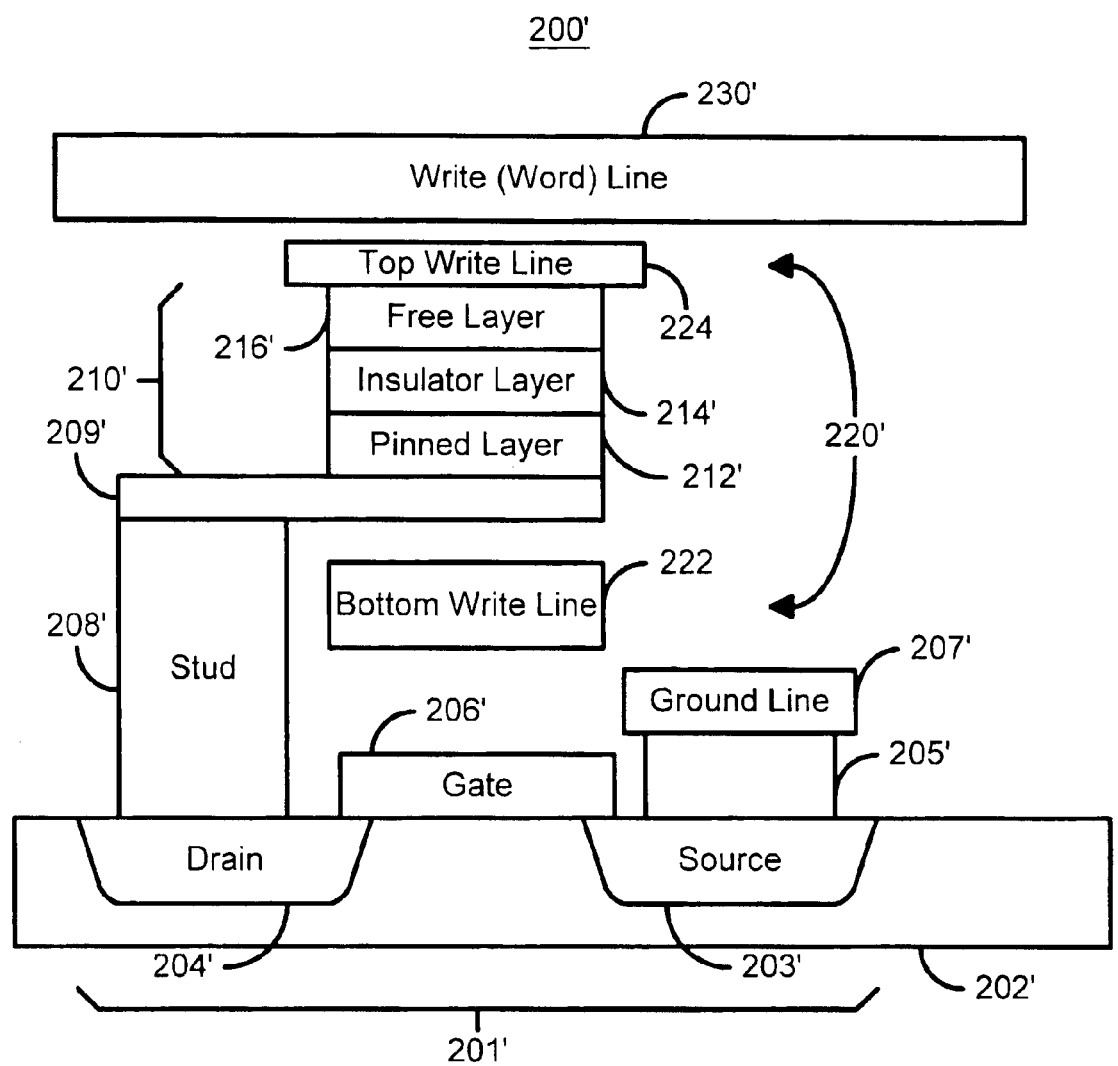
FIG. 6 is a cross-sectional view of a portion of a second embodiment of a magnetic memory including at least one wrapped write line in accordance with the present invention.
Figure 7:
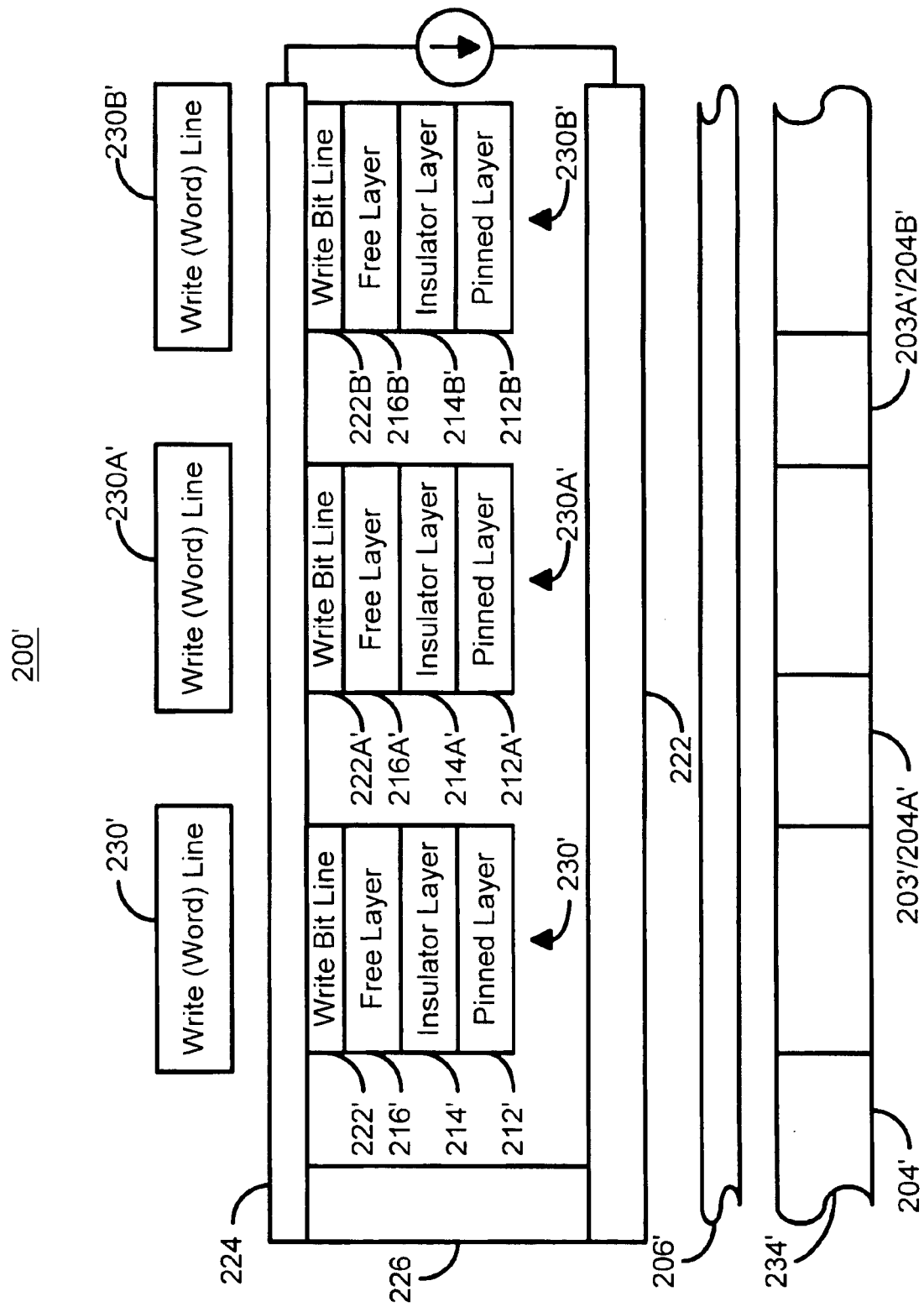
FIG. 7 is a cross-sectional view, orthogonal to the view depicted in FIG. 6, of three magnetic memory cells in the second embodiment of a magnetic memory in accordance with the present invention.

FIG. 6 is a cross-sectional view of a portion of a second embodiment of a magnetic memory 200' including at least one wrapped write line in accordance with the present invention. FIG. 7 is a cross-sectional view, orthogonal to the view depicted in FIG. 6, of three magnetic memory cells 210', 210A', and 210B', in the second embodiment of a magnetic memory in accordance with the present invention. Referring to FIGS. 6 and 7, the components of the magnetic memory 200' in FIGS. 6 and 7 correspond to the components of the magnetic memory 200 depicted in FIG. 5. Consequently, the components are labeled similarly. However, the write line 230' is not a wrapped write line. Instead, the write line 230' includes a single portion, preferably residing above the magnetic element 210'. The write line 220' is, however, a wrapped write line 220'. Consequently, the wrapped write line 220' includes a bottom wrapped write line 222 and a top wrapped write line 224.

In the magnetic memory 200', the free layer easy axis is preferably along write line 230', which is the word line. The bit line 220' has a looped structure consisting of top bit line 224, a bottom bit line 222 and stud 226 connecting the bottom write line 222 and the top write line 224. In a preferred embodiment, the top write line 224 is separated from the free layer 216', 216A', and 216B; such that the top write line 224 is magnetostatically coupled with the free layer 216', 216A', and 216B'. During writing, a current is fed into the write line 230' to rotate the magnetization of the free layer 216', 216A', and 216B' away from its easy axis. With the current in the write line 230' on, a second current is fed into the wrapped bit line 220', which produces two magnetic fields associated with the bit current. The wrapped line 220' thus functions in an analogous manner to the wrapped write line 230 depicted in FIGS. 4 and 5. Referring back to FIGS. 6 and 7, one field is associated with the bottom write line 222 and the other field with the top write line 224. As a consequence, the write efficiency of the bit line 220' is improved in a manner that is analogous to that discussed above with respect to the wrapped write line 230' depicted in FIGS. 4 and 5. Referring back to FIGS. 6 and 7, in a preferred embodiment, where the free layers 216', 216A', and 216B are approximately equidistant from the bottom write line 222 and the top write line 224, the improvement in efficiency is approximately one hundred percent. Moreover, a further reduction in write current can be achieved if the wrapped write line 220' is a magnetic write line, as described in the above-identified co-pending patent application.

Referring to FIGS. 4, 5, 6, and 7, in preferred embodiments of the magnetic memories 200 and 200', the space between the line 230 and 230', respectively, and the free layers 216, 216A, and 216B and 216', 216A', and 216B, respectively, is less than the lateral dimensions (horizontal as shown in FIGS. 4–7) of the free layers 216, 216A, and 216B and 216', 216A', and 216B, respectively. Also in a preferred embodiment, the space between the bottom write line 222' or 232' and free layers 216, 216A, and 216B and 216', 216A', and 216B, respectively, is less than the lateral dimension of free layer 216, 216A, and 216B and 216', 216A', and 216B, respectively. Currently, using state-of-the-art photolithography technology, a device size of less than 0.13 $\mu$m by 0.13 $\mu$m can be achieved. Consequently, the spaces described above are less than a few hundred angstroms. The thickness of the write (bit) line 220 and 224 is, therefore, no more than a few hundred angstroms. The material used for the write line 220 and 224 should be able to accommodate relatively large current density without having the issues due to electromigration. One candidate of for such a material is Nickel-iron film, which has been used for magnetoresistive read sensors in hard drives and has been shown to be capable of carrying a current in excess of approximately $10^8$ A/cm$^2$. As a comparison, copper and aluminum have a relatively low electromigration limit for current density of about $2-5\times10^5$ A/cm$^2$.

Figure 8:
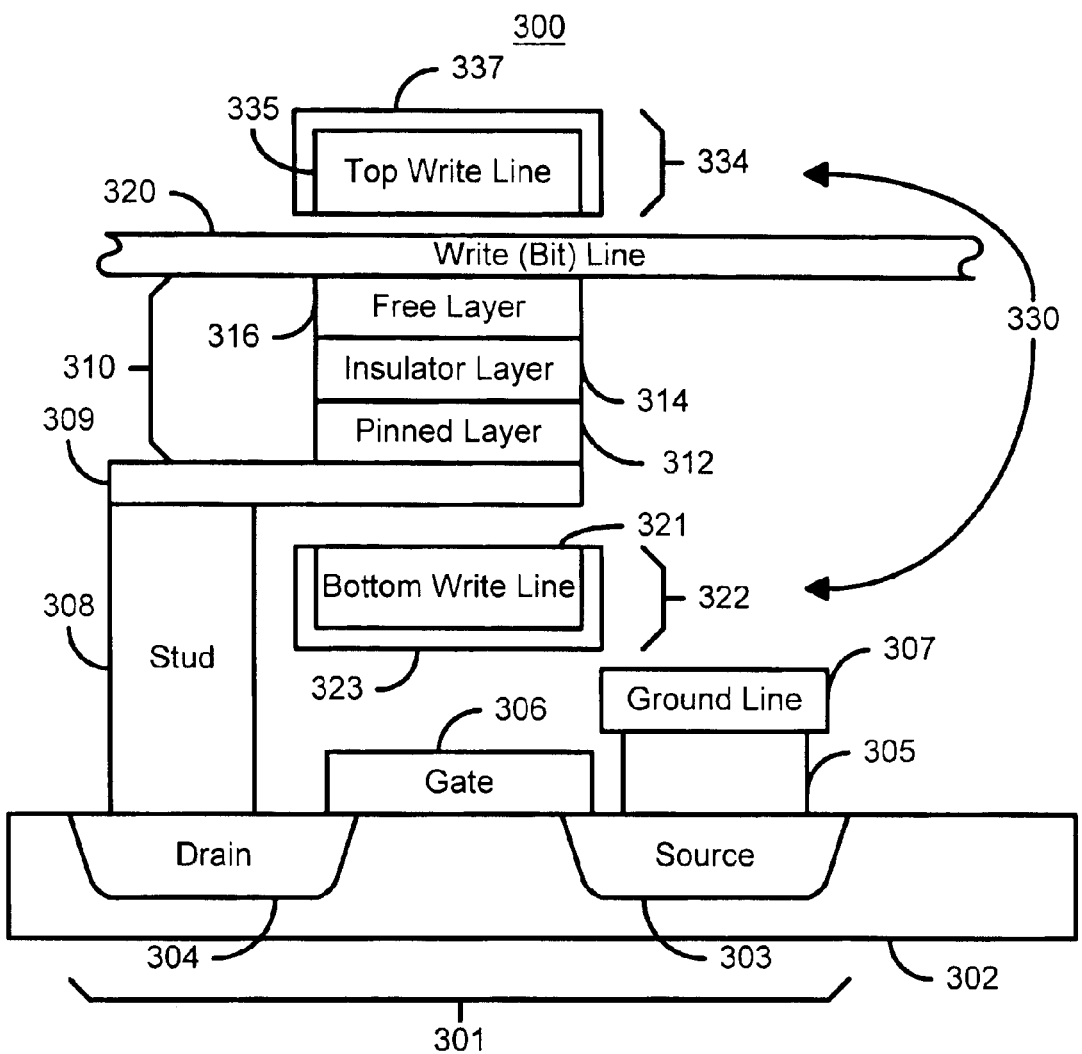
FIG. 8 is a cross-sectional view of a portion of a third embodiment of a magnetic memory including at least one wrapped write line in accordance with the present invention.

FIG. 8 is a cross-sectional view of a portion of a third embodiment of a magnetic memory 300 including at least one wrapped write line in accordance with the present invention. The components of the magnetic memory 300 in FIG. 8 correspond to the components of the magnetic memory 200 depicted in FIG. 4. Consequently, the components are labeled similarly. For example, the write line 330 is a wrapped write line analogous to the wrapped write line 230. The write line 320 is a bit line similar to the bit line 220. Similarly, the magnetic memory 300 includes a magnetic element 310 that is preferably an MTJ stack 310 including a pinned layer 312, an insulating barrier layer 314, and a free layer 316. The magnetic memory 300 also includes a selection device 301 formed on a substrate 302 and including a source 303, a drain 304 and a gate 306. The source 303 is coupled to a ground line 307 through a conductive plug 305. The drain 304 is coupled to the MTJ stack 310 using a conductive plug 308 and a conductive layer 309. Also in a preferred embodiment, the thickness of the write line 320 is preferably less than the lateral dimensions of the magnetic element 310.

The magnetic memory 300 functions in substantially the same manner as the magnetic memories 100 and 200. Thus, current is driven through the write line 320 and the wrapped write line 330 during programming. The wrapped write line 330 includes the bottom write line 332 and the top write line 334. The bottom write line 332 includes a nonmagnetic core 331 and a soft magnetic cladding layer 323. Similarly, the top write line 334 includes a nonmagnetic core 335 and a soft magnetic cladding layer 337. The soft magnetic cladding layer can further improve write efficiency by focusing the magnetic field onto the free layer 316.

The magnetic memory 300 shares the benefits of the magnetic memories 100 and 200 depicted in FIGS. 3 and 4, respectively. Consequently, a lower write current can be driven through the wrapped write line 330 during programming. In a preferred embodiment, the current driven through the wrapped write line 330 is half of the current that would be used in writing if the only the bottom write line 332 or only the top write line 334 is used. In such an embodiment, a one hundred percent reduction in write current through the wrapped write line 330 can be achieved. In addition, the use of the soft magnetic cladding layers 333 and 337 further reduces the write current driven through the wrapped write line 330 by focusing the magnetic field onto the free layer 316 of the magnetic element(s) being written.

Figure 9:
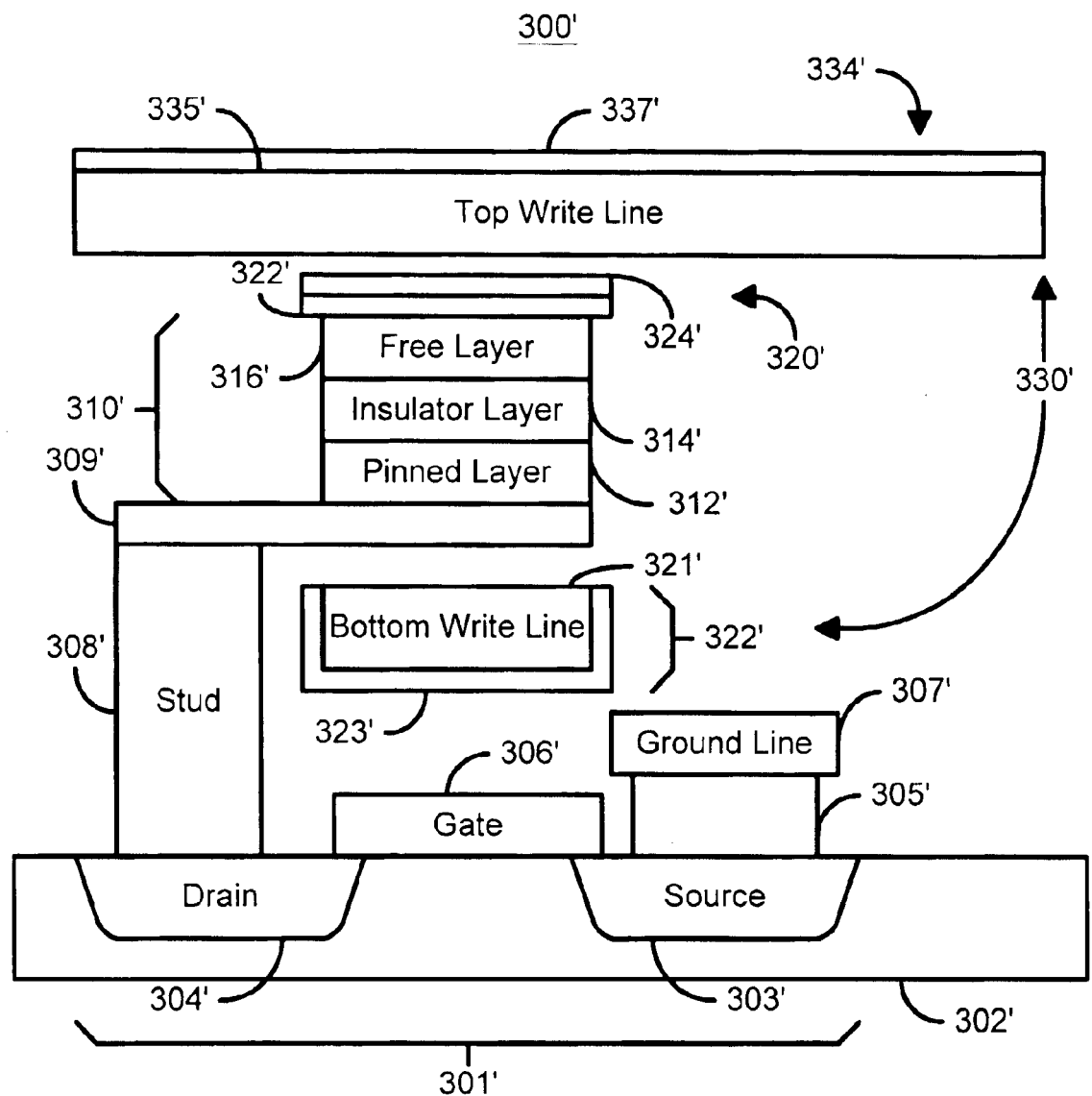
FIG. 9 is a cross-sectional view of a portion of a fourth embodiment of a magnetic memory including at least one wrapped write line in accordance with the present invention.

FIG. 9 is a cross-sectional view of a portion of a fourth embodiment of a magnetic memory 300' including at least one wrapped write line in accordance with the present invention. The components of the magnetic memory 300' in FIG. 9 correspond to the components of the magnetic memory 300 depicted in FIG. 8. Consequently, the components are labeled similarly. For example, the write line 330' is a wrapped write line analogous to the wrapped write line 330. The write line 320' is a write line similar to the write line 320. Similarly, the magnetic memory 300', includes a magnetic element 310' that is preferably an MTJ stack 310' including a pinned layer 312', an insulating barrier layer 314', and a free layer 316'. The magnetic memory 300' also includes a selection device 301' formed on a substrate 302' and including a source 303', a drain 304' and a gate 306'. The source 303' is coupled to a ground line 307' through a conductive plug 305'. The drain 304' is coupled to the MTJ stack 310' using a conductive plug 308' and a conductive layer 309'. Also in a preferred embodiment, the thickness of the write line 320' is preferably less than the lateral dimensions of the magnetic element 310'.

The magnetic memory 300' functions in substantially the same manner as the magnetic memories 100 and 200. Thus, current is driven through the wrapped write line 330' and the write line 320' during programming. The wrapped write line 330' includes the bottom write line 332' and the top write line 334'. The bottom write line 332' includes a nonmagnetic core 331' and a soft magnetic cladding layer 333'. Similarly, the top write line 334' includes a nonmagnetic layer 335' and a soft magnetic cladding layer 337'. However, the write (bit) line 320' includes two layers a nonmagnetic layer 322 and a magnetic layer 324. The nonmagnetic layer 322 is preferably a high conductance layer. The magnetic layer 324 is preferably magnetostatically coupled to the free layer 316'. The soft magnetic cladding layers 331' and 337' can further improve write efficiency by focusing the magnetic field onto the free layer 316.

The magnetic memory 300' shares the benefits of the magnetic memories 100, 200, and 300 depicted in FIGS. 3, 4, and 8, respectively. Consequently, a lower write current can be driven through the wrapped write line 330 during programming. In a preferred embodiment, the current driven through the wrapped write line 330 is half of the current that would be used in writing if the only the bottom write line 332 or only the top write line 334 is used. In such an embodiment, a one hundred percent reduction in write current through the wrapped write line 330 can be achieved.

In addition, the use of the soft magnetic cladding layers 333 and 337, as well as the use of the magnetic layer 324, further reduces the write current driven through the wrapped write line 330 and the write line 320, respectively.

Figure 10:
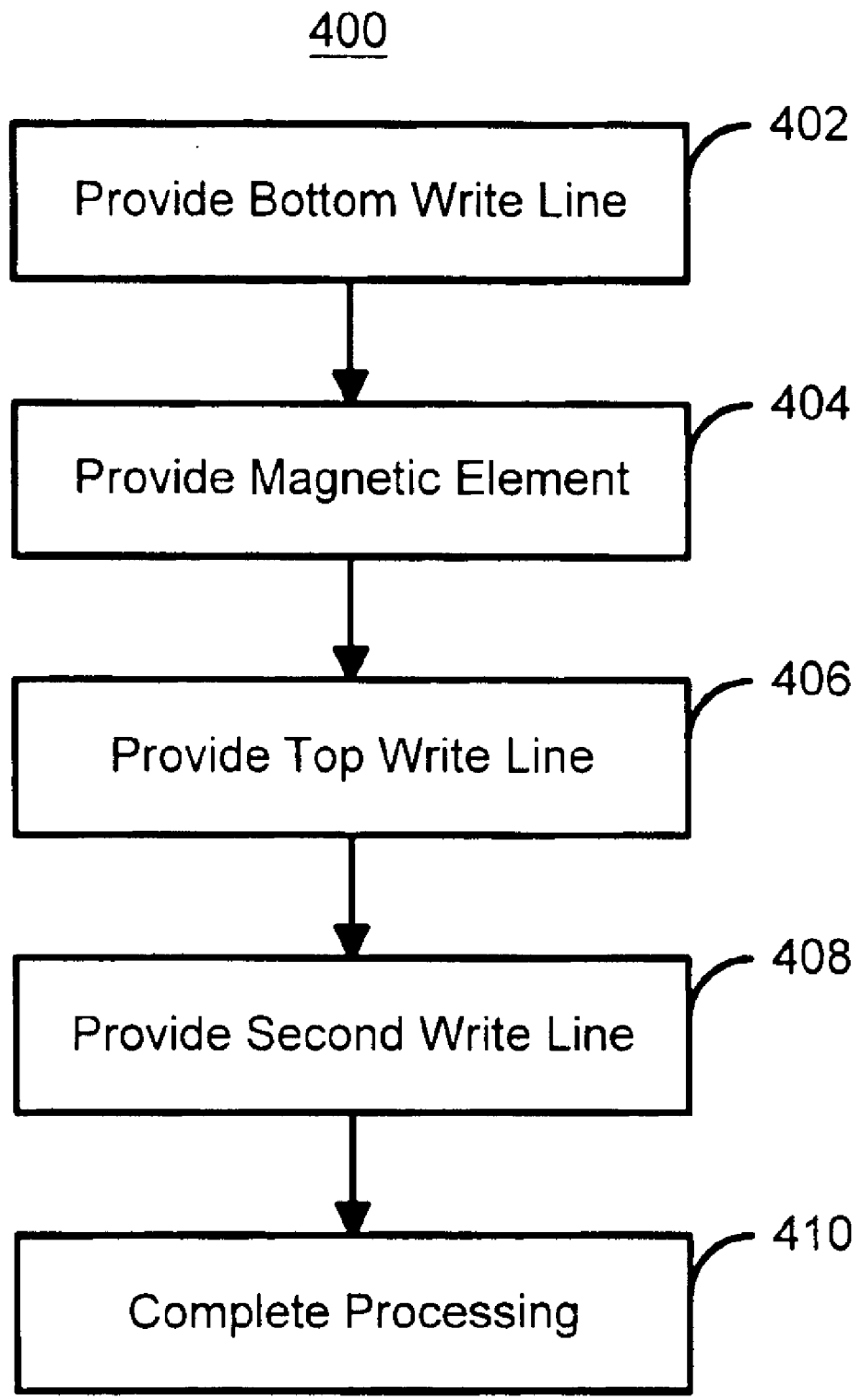
FIG. 10 is a high-level block diagram of one embodiment of a method for providing a magnetic memory in accordance with the present invention.

FIG. 10 is a high-level block diagram of one embodiment of a method 400 for providing a magnetic memory in accordance with the present invention. The method 400 is described in the context of the magnetic memory 100, depicted in FIG. 3. However, the method 400 can be used for the magnetic memory 200, 200', 300, and/or 300'. Referring to FIGS. 3 and 10, a bottom write line 122 of the wrapped write line 120 is provided, via step 402. The bottom write line 122 could be for a word line or a bit line. Step 402 could include forming the bottom write line 122 to be magnetic or to have magnetic cladding. The magnetic element 110 is provided, via step 404. A top write line 124 is provided, via step 406. Step 406 preferably includes electrically coupling the top write line 124 with the bottom write line. Step 406 could include forming the top write line 124 to be magnetic or to have magnetic cladding. Another write line (not shown in FIG. 3) is also preferably provided, via step 408. If the wrapped write line 120 is a bit line, then step 408 is preferably performed after step 406. If the wrapped write line 120 is a word line, then step 408 is preferably performed before step 408. Other processing of the magnetic memory 100 can then be performed, via step 410.

A method and system has been disclosed for providing an improved magnetic memory having reduced power consumption. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising:

a plurality of magnetic memory elements;

at least one wrapped write line, each of the at least one wrapped write line including a bottom write line and a top write line, the bottom write line residing below a portion of the plurality of magnetic elements, the top write residing above the portion of the plurality of magnetic elements, the bottom write line for carrying a first current in a first direction, the top write line for carrying a second current in a second direction opposite to the first direction.

2. A magnetic memory comprising:

a plurality of magnetic memory elements;

at least one wrapped write line, each of the at least one wrapped write line including a bottom write line and a top write line electrically connected to the bottom write line, the bottom write line residing below a portion of the plurality of magnetic elements, the top write residing above the portion of the plurality of magnetic elements, the bottom write line for carrying a first current in a first direction, the top write line for carrying a second current in a second direction opposite to the first direction.

3. The magnetic memory of claim 2 wherein the bottom write line is a magnetic bottom write line including a soft magnetic material.

4. The magnetic memory of claim 3 wherein the bottom write line includes a plurality of layers, a portion of the plurality of layers including the soft magnetic material.

5. The magnetic memory of claim 2 wherein the bottom write line includes a nonmagnetic core having a plurality of surfaces and a magnetic cladding layer on a portion of the plurality of surface.

6. The magnetic memory of claim 2 wherein the top write line is a magnetic top line including a soft magnetic material.

7. The magnetic memory of claim 6 wherein the top write line includes a plurality of layers, a portion of the plurality of layers including the soft magnetic material.

8. The magnetic memory of claim 2 wherein the top write line includes a nonmagnetic core having a plurality of surfaces and a magnetic cladding layer on a portion of the plurality of surface.

9. The magnetic memory of claim 2 wherein of the at least one wrapped write line is electrically connected to the plurality of magnetic elements.

10. The magnetic memory of claim 9 wherein the top write line is electrically connected to the portion of the plurality of magnetic elements.

11. The magnetic memory of claim 2 further comprising:

at least a second write line oriented substantially orthogonal to the at least one wrapped write line.

12. The magnetic memory of claim 11 wherein the at least the second write line is electrically connected to the plurality of magnetic elements.

* * * * *